US012801036B2

(12) United States Patent
Wang et al.

(10) Patent No.: US 12,801,036 B2
(45) Date of Patent: Nov. 17, 2026

(54) HIGH-CLEANLINESS RETICLE CLAMPING MODULE

(71) Applicant: GUDENG EQUIPMENT CO., LTD., New Taipei City (TW)

(72) Inventors: An-Pang Wang, New Taipei City (TW); Bing-Hong Tsai, New Taipei City (TW); Hui-Ju Yang, New Taipei City (TW)

(73) Assignee: GUDENG EQUIPMENT CO., LTD., New Taipei City (TW)

( * ) Notice: Subject to any disclaimer, the term of this patent is extended or adjusted under 35 U.S.C. 154(b) by 84 days.

(21) Appl. No.: 18/963,550

(22) Filed: Nov. 28, 2024

(65) Prior Publication Data

US 2025/0181000 A1 Jun. 5, 2025

(30) Foreign Application Priority Data

Nov. 30, 2023 (TW) ................................ 112146629

(51) Int. Cl.
*G03F 7/00* (2006.01)
*G01V 8/10* (2006.01)

(52) U.S. Cl.
CPC ............ *G03F 7/70741* (2013.01); *G01V 8/10* (2013.01); *G03F 7/70525* (2013.01); *G03F 7/7085* (2013.01); *G03F 7/70916* (2013.01); *G03F 7/70933* (2013.01); *G03F 7/7095* (2013.01)

(58) Field of Classification Search
CPC ............. G03F 7/70741; G03F 7/70525; G03F 7/7085; G03F 7/70916; G03F 7/70933; G03F 7/7095; G03F 7/707; G01V 8/10
See application file for complete search history.

(56) References Cited

U.S. PATENT DOCUMENTS

| | | | | |
|---|---|---|---|---|
| 5,301,013 A * | 4/1994 | Meijer | G03F 7/70741 356/400 |
| 7,167,233 B2 * | 1/2007 | Van De Ven | G03F 7/70741 355/75 |
| 12,013,649 B1 * | 6/2024 | Lin | G03F 1/66 |
| 12,117,738 B2 * | 10/2024 | Liang | G03F 7/7085 |
| 12,189,312 B2 * | 1/2025 | Wiener | G03F 7/709 |

FOREIGN PATENT DOCUMENTS

| | | |
|---|---|---|
| CN | 116344434 A | 6/2023 |
| TW | I806788 B | 6/2023 |
| WO | 00/47501 A1 | 8/2000 |

* cited by examiner

*Primary Examiner* — Hung V Nguyen

(57) ABSTRACT

A high-cleanliness reticle clamping module includes: two clamping mechanisms and at least one optical sensing mechanism, the two clamping mechanisms are disposed facing each other and clamp out a reticle space, each of the two clamping mechanisms includes a shielding component, a gripper component and a power component, the shielding component is disposed on a back side of the gripper component opposite to a reticle contact surface, the power component is disposed in an accommodating space of the shielding component, and drives the shielding component and the gripper component to move back and forth, the at least one optical sensing mechanism is disposed in one of the accommodating spaces of the two clamping mechanisms for detecting whether a reticle exists in the reticle space.

6 Claims, 4 Drawing Sheets

HIGH-CLEANLINESS RETICLE CLAMPING MODULE

CROSS-REFERENCE TO RELATED APPLICATION

This non-provisional application claims priority under 35 U.S.C. § 119(a) on Patent Application No(s). 112146629 filed in Taiwan, R.O.C. on Nov. 30, 2023, the entire contents of which are hereby incorporated by reference.

BACKGROUND OF THE INVENTION

1. Field of the Invention

The present application relates to a reticle clamping module, and in particular to a high-cleanliness reticle clamping module.

2. Description of the Related Art

In the semiconductor photolithography process, a reticle is required to be used to replicate the pattern onto the wafer. Therefore, the preservation and cleanliness of the reticle are crucial. Generally speaking, the reticle needs to be clamped and moved in a standardized way by using automated equipment such as robotic arms to avoid the reticle being damaged or contaminated by external dust and chemicals. However, automated power equipment such as robotic arms still produce unexpected dust particles, which remain another source of contamination for reticles that place a premium on cleanliness.

BRIEF SUMMARY OF THE INVENTION

Therefore, in order to solve various problems of the traditional reticle clamping and moving, the present application proposes a high-cleanliness reticle clamping module.

To achieve the above objective and other objectives, the present application provides a high-cleanliness reticle clamping module, including: two clamping mechanisms, disposed facing each other and clamping out a reticle space, wherein each of the two clamping mechanisms includes a shielding component, a gripper component and a power component, the shielding component is disposed on a back side of the gripper component opposite to a reticle contact surface, the power component is disposed in an accommodating space of the shielding component, and drives the shielding component and the gripper component to move back and forth; and at least one optical sensing mechanism, disposed in one of the accommodating spaces of the two clamping mechanisms for detecting whether a reticle exists in the reticle space.

In one embodiment of the application, the shielding component has a through hole facing the reticle space, and the optical sensing mechanism emits an optical signal from the through hole toward the reticle space.

In one embodiment of the application, a material of the shielding component is at least partially transparent relative to the optical sensing mechanism.

In one embodiment of the application, the high-cleanliness reticle clamping module further includes a control mechanism, connected the power component and the optical sensing mechanism by signal.

In one embodiment of the application, each of the two clamping mechanisms further includes a dust suction component, which is disposed in the accommodating space.

In one embodiment of the application, the high-cleanliness reticle clamping module further includes a flipping mechanism, connected the two shielding components.

In one embodiment of the application, the high-cleanliness reticle clamping module further includes two flipping mechanisms, respectively disposed in the accommodating spaces.

Accordingly, the high-cleanliness reticle clamping module of the present application uses a shielding component to shade the power component, so that the power component is isolated from the gripper component and the reticle, and thus the gripper component and the reticle are not affected by the possible dust pollution generated by the power component. In addition, the optical sensing mechanism is used to detect whether the reticle exists in the reticle space, so as to avoid the reticle falling or being damaged by force.

DETAILED DESCRIPTION OF THE INVENTION

Figure 1:
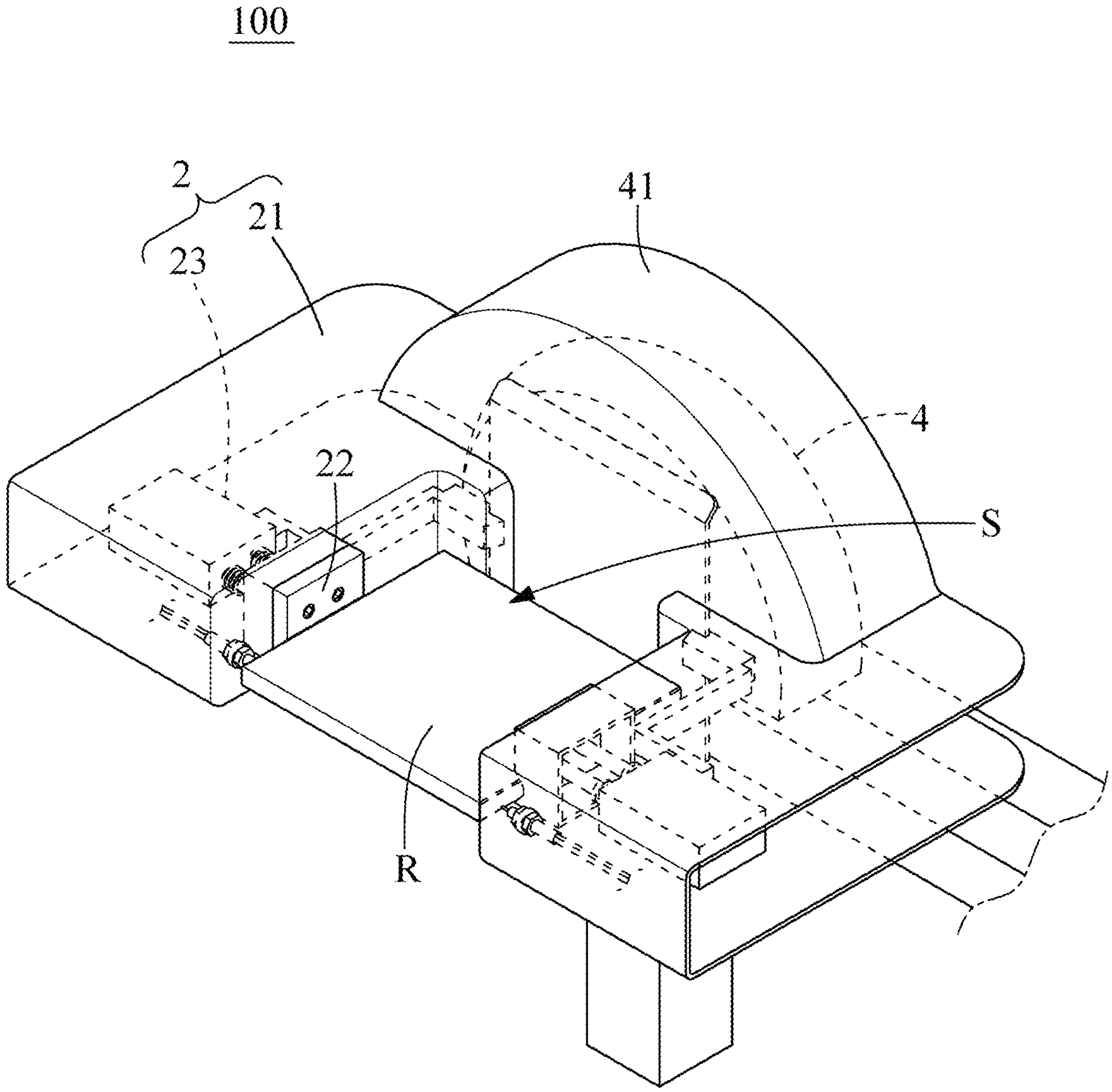
FIG. 1 is a schematic perspective view of a high-cleanliness reticle clamping module according to an embodiment of the present application.
Figure 2:
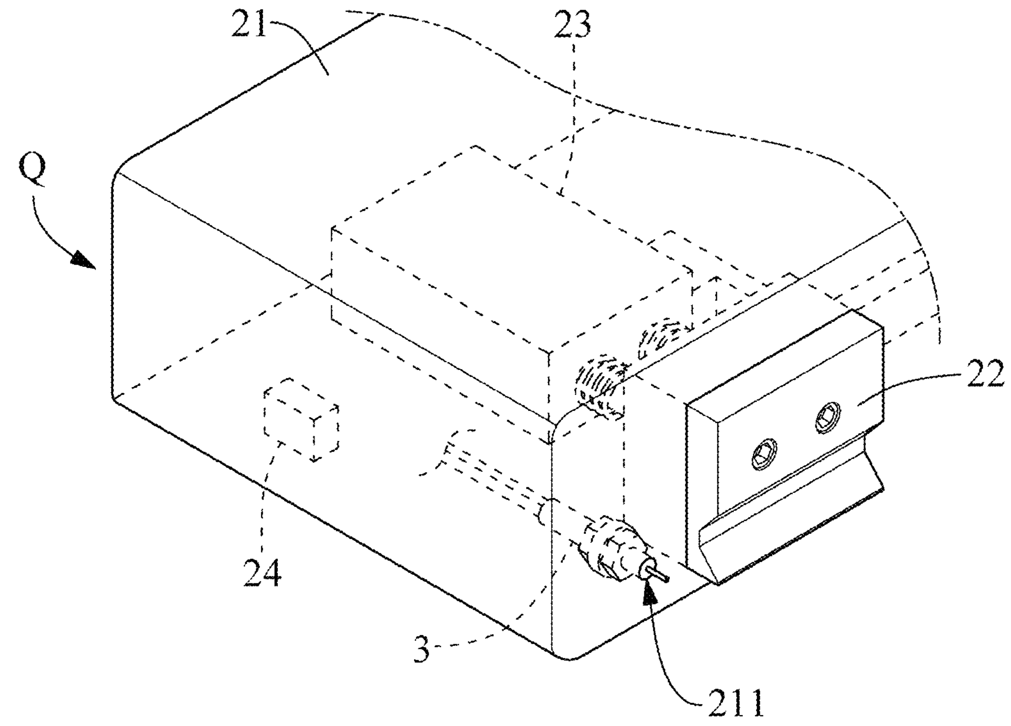
FIG. 2 is a schematic partial enlarged view of the high-cleanliness reticle clamping module according to the embodiment of the present application.
Figure 3:
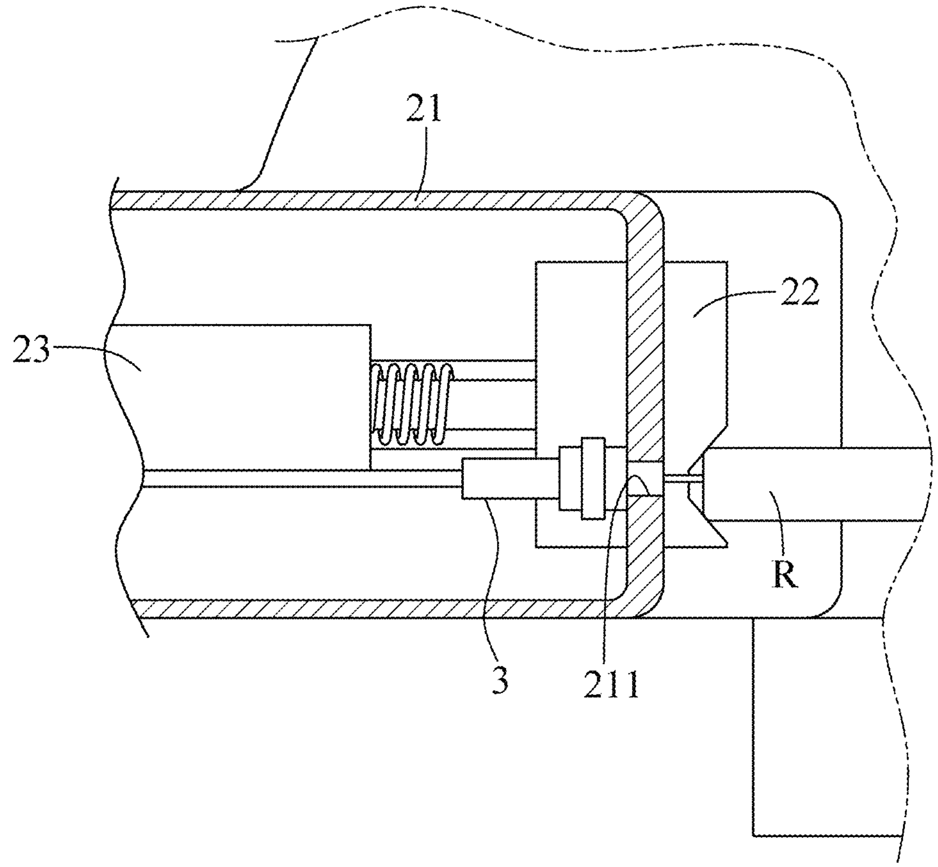
FIG. 3 is a sectional view of the high-cleanliness reticle clamping module according to the embodiment of the present application.

To facilitate understanding of the present application, the following specific embodiments together with the attached drawings for the detailed description of the present application are provided. One skilled in the art can understand the object, characteristics and effects of this present application by the content described in the specification. It should be noted that various possible modifications and alterations to the details of the specification could be carried out by implementing or applying other different embodiments based on different views and applications without departing from the spirit of the present application. The related technical contents of the application will be described in detail by the embodiments. However, the disclosed contents should not be considered to limit the scope of the application. The description is provided as follows:

As shown in FIGS. 1 to 3, a high-cleanliness reticle clamping module 100 according to an embodiment of the present application includes: two clamping mechanisms 2 and at least one optical sensing mechanism 3.

The two clamping mechanisms 2 are disposed facing each other and clamp out a reticle space S, and the reticle space S is used for accommodating a reticle R. The two clamping mechanisms 2 clamp the reticle R from two sides of the reticle R. Each of the two clamping mechanisms 2 includes a shielding component 21, a gripper component 22 and a power component 23.

The gripper component 22 has a gripper to contact and clamp and fix the reticle R. Preferably, the gripper component 22 clamps the reticle R in a line contact manner to reduce the contact area with the reticle R, and can completely grasp the reticle to avoid falling. The gripper component 22 is preferably made of a material that is wearresistant (not easy to generate particulates and dust) and not easy to generate static electricity.

The shielding component 21 is disposed on a back side of the gripper component 22 opposite to a reticle contact surface, the shielding component 21 is preferably presented in the form of a box body, and has an accommodating space Q to accommodate the power component 23 and isolates the power component 23 from the gripper component 22 and the reticle R.

The power component 23 is disposed in the accommodating space Q, which fixedly connects the shielding component 21 and the gripper component 22. For example, the gripper component 22, the shielding component 21 and the power component 23 can be locked in sequence in a locking manner, and the connection and fixation of the three can be achieved. The power component 23 drives the shielding component 21 and the gripper component 22 to move back and forth, so that the gripper component 22 can release or clamp the reticle R. The power component 23, for example, is a device that can provide reciprocating motion power such as a motor or an electric cylinder, and can preferably be controlled by an electric signal to move the stroke.

At least one optical sensing mechanism 3 is disposed in one of the accommodating spaces Q of the two clamping mechanisms 2 for emitting optical signals to the reticle space S to detect whether a reticle R exists in the reticle space S. The optical sensing mechanism 3, for example, is a reflective infrared sensor, or a through beam infrared sensor. If a reflective infrared sensor is used, the emitting element and the receiving element can be located at the same side of the reticle R, and the reflected optical signal can be used to judge whether a reticle R exists in the reticle space S; if a through beam infrared sensor is used, the emitting element and the receiving element are respectively located at the opposite side of the reticle R (e.g., disposed on another clamping mechanism 2); if there are two or more optical sensing mechanisms 3 and they are through beam infrared sensors, the setting positions needs to be staggered. However, the present application is not limited thereto, and in other embodiments, other principles or types of optical sensing mechanisms may be utilized.

To sum up, the high-cleanliness reticle clamping module 100 of the present application uses a shielding component 21 to shade the power component 23, so that the power component 23 is isolated from the gripper component 22 and the reticle R, and thus the gripper component 22 and the reticle R are not affected by the possible dust pollution generated by the power component 23. In addition, the optical sensing mechanism 3 is used to detect whether the reticle R exists in the reticle space S, so as to avoid the reticle R falling or being damaged by force.

Further, in the present embodiment, as shown in FIG. 3, the shielding component 21 has a through hole 211 facing the reticle space S, and the optical sensing mechanism 3 emits an optical signal from the through hole 211 toward the reticle space S. However, the present application is not limited thereto, in other embodiments, the shielding component 21 may not have a through hole 211, and a material of the shielding component 21 is at least partially transparent relative to the optical sensing mechanism 3, that is, the optical signal emitted by the optical sensing mechanism 3 can directly penetrate the shielding component 21.

Further, in the present embodiment, each of the two clamping mechanisms 2 further includes a dust suction component 24, which is disposed in the accommodating space Q. The dust suction component 24 is disposed outside the power component 23 and located in the accommodating space Q, so as to further assist in absorbing the possible dust pollution produced by the power component 23 and avoid dust leaking out from the opening of the shielding component 21.

Figure 4:
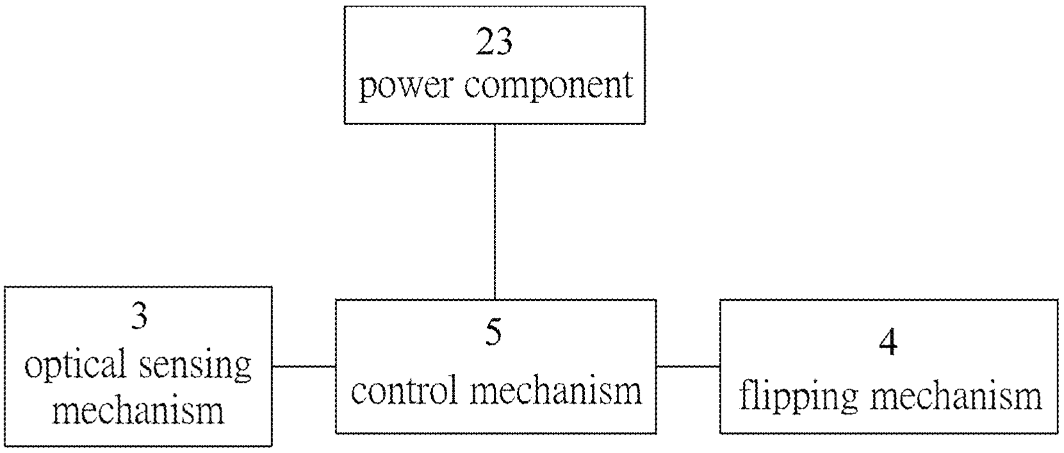
FIG. 4 is a block diagram of the high-cleanliness reticle clamping module according to the embodiment of the present application.

Further, in the present embodiment, as shown in FIG. 4, the high-cleanliness reticle clamping module 100 of the present application further includes a control mechanism 5, connected the power component 23 and the optical sensing mechanism 3 by signal. The control mechanism 5 determines a moving stroke of the power member 23 according to a detection signal of the optical sensing mechanism 3. The control mechanism 5, for example, is a chip or circuit with logic judgment ability, and can be integrated into a computer or human machine interface.

Further, in the present embodiment, as shown in FIG. 1, the high-cleanliness reticle clamping module 100 of the present application further includes a flipping mechanism 4, connected the two shielding components 21. The flipping mechanism 4 is a motor, for example, can provide rotational power to make the two gripper components 22 rotate together. The flipping mechanism 4 is also connected with the control mechanism 5 by signal, and is controlled by the instruction of the control mechanism 5. The flipping mechanism 4 may be further provided with a shield 41 to isolate a power-supplying part from the reticle space S. In FIG. 1, the number of the flipping mechanisms 4 is one and it is respectively connected to the two shielding component 21. However, the present application is not limited thereto, and in other embodiments, the number of the flipping mechanisms 4 may be provided as two and they independently connect a shielding component 21. The two flipping mechanisms 4 can be further respectively disposed in the accommodating space Q of the two shielding components 21.

While the present invention has been described by means of embodiments, those skilled in the art should understand the above embodiments are merely used to describe the present invention, and it should not be considered to limit the scope of the invention. It should be noted that all changes and substitutions which come within the meaning and range of equivalency of the embodiments are intended to be embraced in the scope of the invention. Therefore, the scope of the invention is defined by the claims.

What is claimed is:

1. A high-cleanliness reticle clamping module, comprising:

two clamping mechanisms, disposed facing each other and clamping out a reticle space, wherein each of the two clamping mechanisms includes a shielding housing, a gripper component, a power component and a dust suction component, the shielding housing defines an internal accommodating space and is disposed on a back side of the gripper component opposite to a reticle contact surface, the power component is disposed in the internal accommodating space and drives the shielding housing and the gripper component to move back and forth, and the dust suction component is disposed in the internal accommodating space; and at least one optical sensing mechanism, disposed in the internal accommodating space of one of the two clamping mechanisms, wherein the shielding housing is configured to allow an optical signal from the at least one optical sensing mechanism to pass therethrough to detect whether a reticle exists in the reticle space.

2. The high-cleanliness reticle clamping module according to claim 1, wherein the shielding housing has a through hole facing the reticle space, and the optical sensing mechanism emits the optical signal through the through hole toward the reticle space.

3. The high-cleanliness reticle clamping module according to claim 1, wherein a material of the shielding housing is at least partially transparent relative to the optical sensing mechanism.

4. The high-cleanliness reticle clamping module according to claim 1, further comprising a control mechanism, connected the power component and the optical sensing mechanism by signal.

5. The high-cleanliness reticle clamping module according to claim 1, further comprising a flipping mechanism, connected the two shielding housings.

6. The high-cleanliness reticle clamping module according to claim 1, further comprising two flipping mechanisms, respectively disposed in the internal accommodating spaces.

* * * * *